(12) United States Patent
Fung

(10) Patent No.: US 9,425,257 B2
(45) Date of Patent: Aug. 23, 2016

(54) NON-PLANAR SIGE CHANNEL PFET

(71) Applicant: Taiwan Semiconductor Manufacturing Company Limited, Hsinchu (TW)

(72) Inventor: Ka-Hing Fung, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 24 days.

(21) Appl. No.: 14/084,925

(22) Filed: Nov. 20, 2013

(65) Prior Publication Data

US 2015/0137268 A1    May 21, 2015

(51) Int. Cl.
*H01L 29/10* (2006.01)
*H01L 29/08* (2006.01)
*H01L 29/16* (2006.01)
*H01L 29/66* (2006.01)
*H01L 29/78* (2006.01)

(52) U.S. Cl.
CPC .......... *H01L 29/1054* (2013.01); *H01L 29/785* (2013.01); *H01L 29/7848* (2013.01); *H01L 29/66628* (2013.01); *H01L 29/66636* (2013.01)

(58) Field of Classification Search
None
See application file for complete search history.

(56) References Cited

U.S. PATENT DOCUMENTS

| | | | |
|---|---|---|---|
| 7,045,401 B2 | 5/2006 | Lee et al. | |
| 7,326,634 B2 | 2/2008 | Lindert et al. | |
| 7,767,560 B2 | 8/2010 | Jin et al. | |
| 7,993,999 B2 | 8/2011 | Basker et al. | |
| 8,053,299 B2 | 11/2011 | Xu | |
| 8,283,653 B2 | 10/2012 | Pillarisety et al. | |
| 2006/0076625 A1* | 4/2006 | Lee | H01L 29/7851 257/353 |
| 2007/0032009 A1* | 2/2007 | Currie et al. | 438/199 |
| 2007/0164364 A1* | 7/2007 | Kawasaki | H01L 21/823425 257/368 |
| 2007/0278565 A1 | 12/2007 | Tu et al. | |
| 2008/0128750 A1 | 6/2008 | Enicks | |
| 2011/0223735 A1* | 9/2011 | Yu | H01L 29/66795 438/299 |
| 2012/0161249 A1* | 6/2012 | Kronholz | H01L 21/823807 257/402 |

FOREIGN PATENT DOCUMENTS

| | | |
|---|---|---|
| JP | 2007142408 | 6/2007 |
| KR | 20060130704 | 12/2006 |

OTHER PUBLICATIONS

Taiwanese Office Action; Application No. 103115924; dated Oct. 20, 2015.
Korean Office Action; Application No. 10-2014-0162593; dated Mar. 14, 2016.

* cited by examiner

*Primary Examiner* — Khaja Ahmad
(74) *Attorney, Agent, or Firm* — Jones Day

(57) ABSTRACT

Systems and methods are provided for fabricating a semiconductor device structure. An example semiconductor device structure includes a channel layer formed of a Germanium compound having a Germanium concentration B formed on a semiconductor substrate having a Germanium concentration of A, the Germanium concentration of the substrate A being less than the Germanium concentration of the channel layer B. The structure further includes a capping layer formed to separate the channel layer from a metal gate, the capping layer having a Germanium concentration of C, the Germanium concentration of the channel layer B being greater than the Germanium concentration of the capping layer C.

20 Claims, 3 Drawing Sheets

NON-PLANAR SIGE CHANNEL PFET

FIELD

The technology described in this disclosure relates generally to semiconductor device structures and more particularly to multi-layer structures.

BACKGROUND

Non-planar transistor structures provide a means to achieve high device performance in a small footprint. The fabrication of such structures is often limited by the material properties of the substances used to create those structures. Channel material engineering in non-planar transistor structures, such as tri-gate, finFET, and gate-all-around architectures, as described herein, offers an opportunity to achieve high mobility and improve transistor performance.

SUMMARY

In accordance with the teachings described herein, systems and methods are provided for fabricating a semiconductor device structure. An example semiconductor device structure includes a channel layer formed of a Germanium compound having a Germanium concentration B formed on a semiconductor substrate having a Germanium concentration of A, the Germanium concentration of the substrate A being less than the Germanium concentration of the channel layer B. The structure further includes a capping layer formed to separate the channel layer from a metal gate, the capping layer having a Germanium concentration of C, the Germanium concentration of the channel layer B being greater than the Germanium concentration of the capping layer C.

In one embodiment, a method is provided for fabricating a semiconductor device structure. A channel layer of a Germanium compound is formed having a Germanium concentration B on a semiconductor substrate having a Germanium concentration of A, the Germanium concentration of the substrate A being less than the Germanium concentration of the channel layer B. A capping layer is formed to separate the channel layer from a metal gate, the capping layer having a Germanium concentration of C, the Germanium concentration of the channel layer B being greater than the Germanium concentration of the capping layer C.

DETAILED DESCRIPTION

Figure 1:
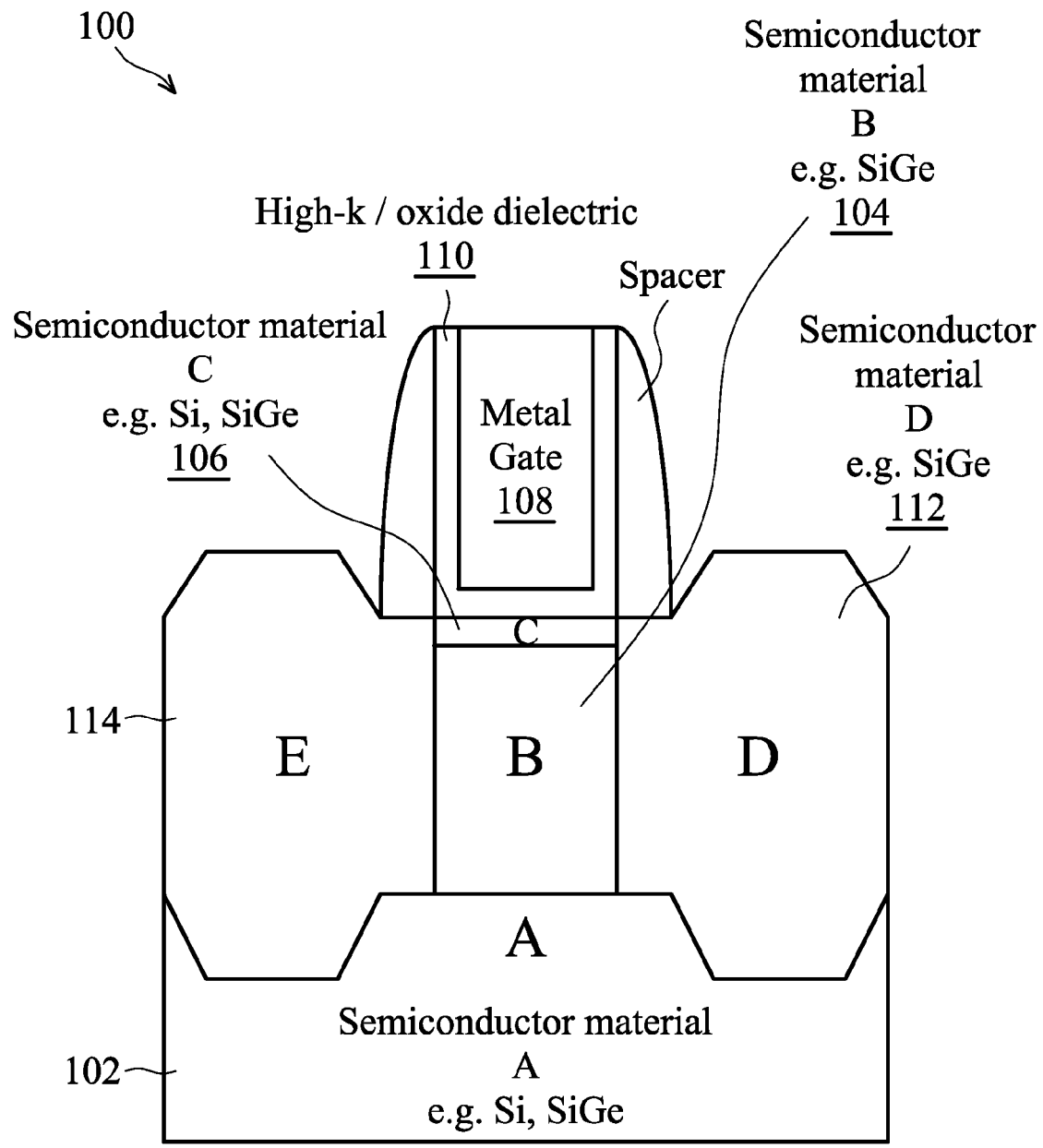
FIG. 1 is a diagram depicting a multi-layer semiconductor device structure that includes a Germanium-containing channel layer along a channel direction.

FIG. 1 depicts an example diagram showing a multi-layer semiconductor device structure that includes a Germanium-containing channel layer. Utilization of a Germanium-containing channel layer made from a material such as Ge or SiGe provides a mechanism for improving PFET drive current enhancement through the introduction of higher stress, improved quantum well confinement, and higher intrinsic mobility over conventional systems that utilize Silicon channels. FIG. 1 is an along-channel view of such a semiconductor device structure 100 having a Germanium-containing channel layer. A semiconductor material forms a substrate 102 onto which successive structures are applied. The substrate 102 takes a variety of forms in different implementations, such as a Silicon substrate or a Germanium-containing substance such as Silicon Germanium having a Germanium concentration of A (e.g., A % Germanium). A second semiconductor material is used to form a channel layer 104 on top of the substrate 102. The channel layer 104 is formed of a Germanium compound having a Germanium concentration of B. In one embodiment, the Germanium concentration of the substrate A is less than the Germanium concentration of the channel layer B (i.e., B>A). In another embodiment, the Germanium concentration of the substrate A is equal to the Germanium concentration of the channel layer B.

It is desirable in one embodiment of the disclosure for the Germanium concentration of the substrate A to be less than the Germanium concentration of the channel layer B, but not too much less. A significant disparity between A and B has been found to increase the likelihood of certain crystal defects in certain implementations. To help in avoiding such defects, the Germanium concentrations of the substrate A and the channel layer B are selected such that, when those concentrations are expressed as percentages, the Germanium concentration of the channel layer B minus the Germanium concentration of the substrate A is less than 50% (i.e., B−A<50%).

FIG. 1 further depicts a capping layer 106 formed to separate the channel layer 104 from a metal gate 108. The capping layer is formed of a Germanium-containing substance having a Germanium concentration of C. To confine holes within the channel layer, in one embodiment, the capping layer is formed such that the Germanium concentration of the channel layer B is greater than the Germanium concentration of the capping layer C (i.e., B>C). The capping layer is fabricated as a thin layer with a low Germanium content, including as a substantially Silicon layer having a Germanium concentration of substantially zero (i.e. <5%). Additional layers are interspersed among the above described layers in certain embodiments, such as a dielectric layer 110, which is formed of an oxide dielectric including a high-k oxide dielectric.

To formulate semiconductor structures such as transistors, certain uni-axial stress inducing portions are incorporated into a semiconductor device structure. For example, such uni-axial stress inducing portions function as source and drain portions of a fabricated transistor in certain implementations. FIG. 1 depicts two such portions at 112, 114. The uni-axial stress inducing portions 112, 114 are formed above the semiconductor substrate 102 and adjacent to the channel layer 104. To provide compressive stress to the channel layer 104, one or both of the uni-axial stress inducing portions 112, 114 are fabricated so as to have a Germanium concentration D that is greater than or equal to the Germanium concentration of the channel layer B (i.e., D≥B). In certain implementations the Germanium concentration of the uni-axial stress inducing portion D is also greater than the Germanium concentration of the substrate A (i.e., D>A). However, to avoid a large lattice mismatch between a uni-axial stress inducing portion 112, 114 and the substrate 102, the Germanium concentration of the uni-axial stress inducing portion D is selected so that, when expressed as a percentage, the Germanium concentration of the uni-axial stress inducing portion D minus the Germanium concentration of the substrate A is less than 50% (i.e., D−A<50%).

FIG. 1 depicts a semiconductor device structure 100 configured to operate as a transistor. Thus, a first uni-axial stress inducing portion 112 having a Germanium concentration D is configured to operate as a source of a field effect transistor, and a second uni-axial stress inducing portion 114 having a Germanium concentration E, which is equal to D in certain implementations, is configured to operate as a drain of the field effect transistor. The metal gate 108 is configured to function as a gate of the field effect transistor, where the field effect transistor exhibits certain desirable traits, such as proper functioning using $V_{DD} > 0.6$ V in certain implementations.

The uni-axial stress inducing portions 112, 114 is varied in other ways in certain implementations. For example, in one embodiment, the Germanium concentration of a uni-axial stress inducing portion 112, 114 is graded from a top portion to a bottom portion such that the Germanium concentration at a top portion $D_1$ of a uni-axial stress inducing portion is greater than the Germanium concentration at a bottom portion $D_2$. In such an implementation, higher Germanium concentrations are implemented at the top portion $D_1$ while limiting large lattice mismatches at the uni-axial stress inducing portion 112, 114—substrate 102 interface (e.g., selecting Germanium concentrations such that $D_2$–A is less than 50%).

A wide array of semiconductor device structures can be designed to implement certain of the design criteria described herein. In one example, the Germanium concentration of the substrate A 102 is selected to be 30%, the Germanium concentration of the channel layer B 104 is selected to be 60%, the Germanium concentration of the capping layer C 106 is selected to be 0%, and the Germanium concentrations of the uni-axial stress inducing portions D, E 112, 114 are selected to be between 60 and 100%. These concentrations can be varied while still falling within the scope of this invention, including implementations where the Germanium concentration of the substrate A 102 is 0%.

Figure 2:
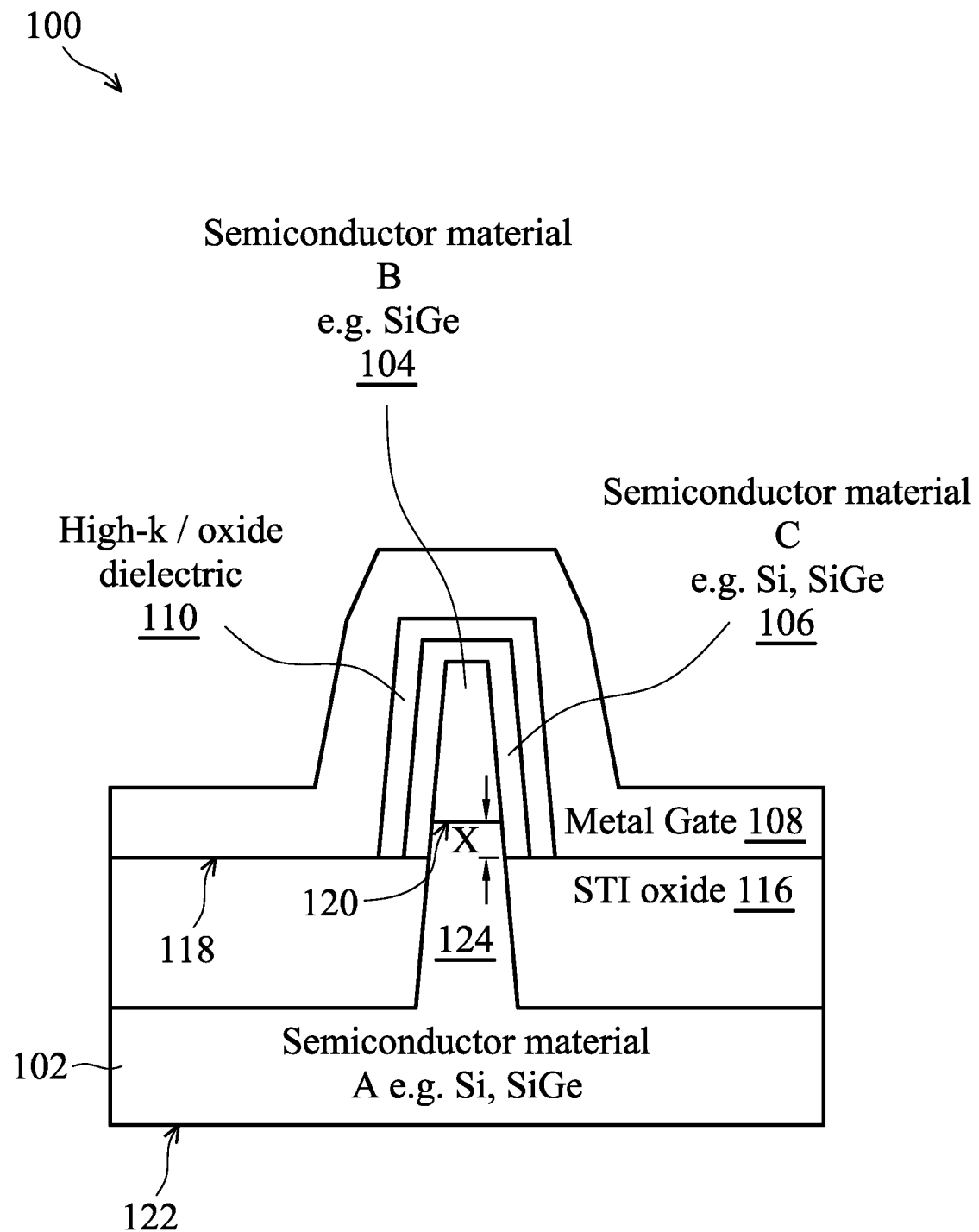
FIG. 2 is a diagram depicting the multi-layer semiconductor device structure that includes a Germanium-containing channel layer along a width direction.

FIG. 2 is a diagram depicting the multi-layer semiconductor device structure that includes a Germanium-containing channel layer along a width direction. The semiconductor device structure 100 includes a channel layer 104 formed of a Germanium compound having a Germanium concentration B formed on a semiconductor substrate 102 having a Germanium concentration A that is less than the Germanium concentration of the channel layer B. A capping layer 106 is formed to separate the channel layer 104 from a metal gate 108, the capping layer 106 having a Germanium concentration of C, where the Germanium concentration of the channel layer B is greater than the Germanium concentration of the capping layer C. The semiconductor device structure depicted in FIG. 2 includes additional layers including a high-k/oxide dielectric layer 110 between the capping layer 106 and the metal gate 108 as well as a shallow trench isolation (STI) oxide layer 116 that is fabricated between the substrate 102 and the metal gate 108.

In one embodiment, the semiconductor device is fabricated so that a bottom surface 118 of the metal gate 108 is not vertically aligned with a bottom surface 120 of the channel layer 104. This offset X, implemented by varying a size of a substrate buffer region 124, can be adjusted to vary certain semiconductor device structure parameters. For example, when X is positive, as shown in FIG. 2 where the bottom surface 120 of the channel layer is further from a base 122 of the semiconductor device structure 100 than the bottom surface 118 of the metal gate 108, $I_{ON}$ degrades due to effective width reduction, while when X is negative, leakage currents are observed to increase. In one embodiment the bottom surface 120 of the channel layer 104 is offset 1 to 5 nm further from the base 122 of the semiconductor device structure than the bottom surface 118 of the metal gate 108. Such offset is varied according to system needs, such as within values of +5 nm to −5 nm.

Figure 3:
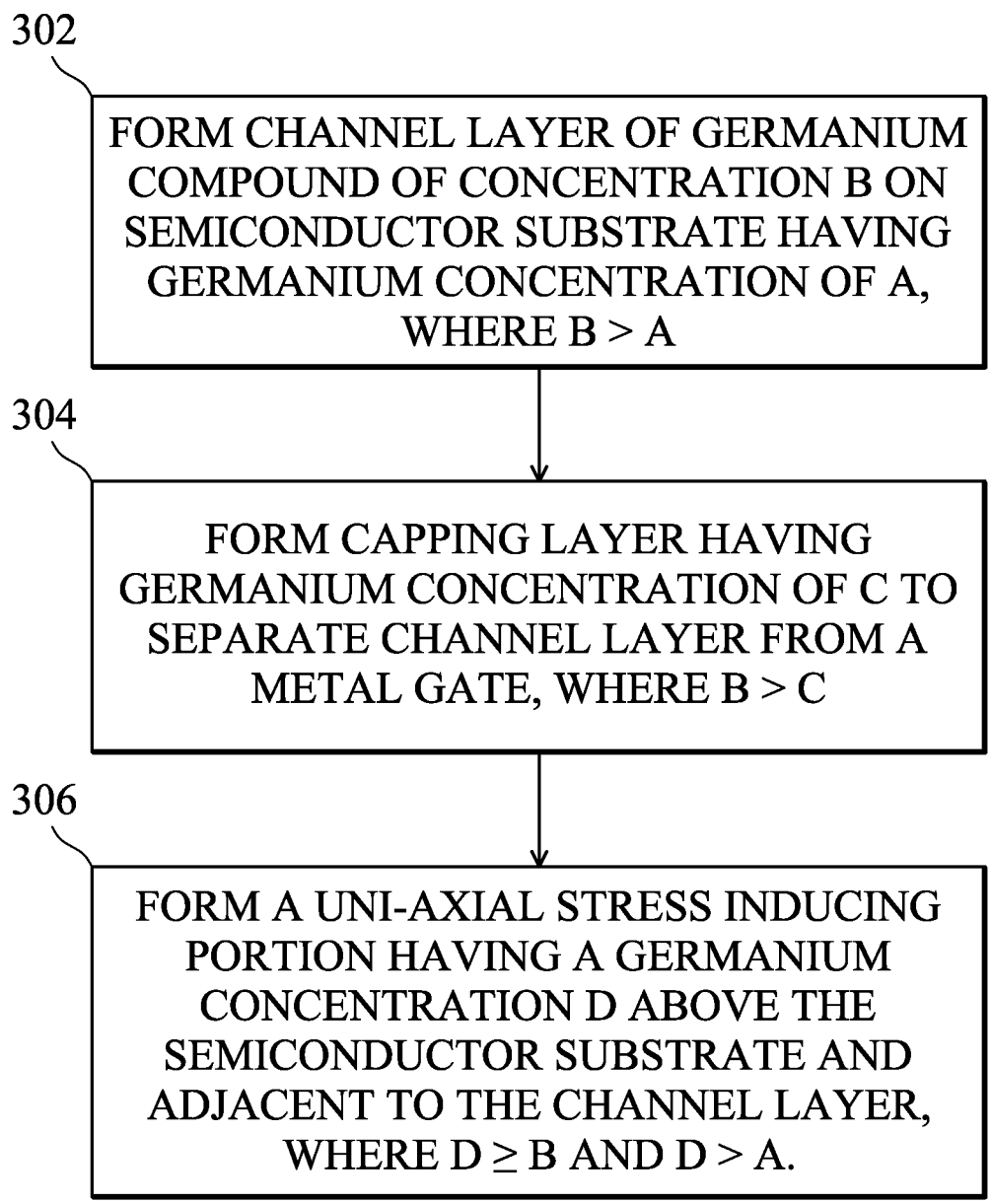
FIG. 3 is a flow diagram depicting a method of fabricating a semiconductor device structure.

FIG. 3 is a flow diagram depicting a method of fabricating a semiconductor device structure. At 302, a channel layer of a Germanium compound is formed having a Germanium concentration B on a semiconductor substrate having a Germanium concentration of A, the Germanium concentration of the substrate A being less than the Germanium concentration of the channel layer B. At 304, a capping layer is formed to separate the channel layer from a metal gate, the capping layer having a Germanium concentration of C, the Germanium concentration of the channel layer B being greater than the Germanium concentration of the capping layer C. At 306, a uni-axial stress inducing portion is formed having a Germanium concentration D above the semiconductor substrate and adjacent to the channel layer, the Germanium concentration of the uni-axial stress inducing portion D being greater than or equal to the Germanium concentration of the channel layer B, and the Germanium concentration of the uni-axial stress inducing portion D being greater than the Germanium concentration of the substrate A.

This written description uses examples to disclose the disclosure, include the best mode, and also to enable a person skilled in the art to make and use the disclosure. The patentable scope of the disclosure may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A semiconductor device structure, comprising:
a semiconductor substrate having a Germanium concentration and including a top surface;
a metal gate including a bottom surface;
a channel layer formed of a Germanium compound having a Germanium concentration and including a top surface and a bottom surface that is in contact with the top surface of the semiconductor substrate, wherein the top surface of the channel layer is at higher elevation than the bottom surface of the metal gate from a bottom surface of the semiconductor substrate, the Germanium concentration of the semiconductor substrate being less than the Germanium concentration of the channel layer; and
a capping layer a portion of which is formed between the top and bottom surfaces of the channel layer to separate the channel layer from the metal gate, the capping layer having a Germanium concentration, the Germanium concentration of the channel layer being greater than the Germanium concentration of the capping layer.

2. The semiconductor device structure of claim 1, further comprising:
a uni-axial stress inducing portion having a Germanium concentration formed above the semiconductor substrate and adjacent to the channel layer, the Germanium concentration of the uni-axial stress inducing portion being greater than or equal to the Germanium concentration of the channel layer.

3. The semiconductor device structure of claim 2, wherein the uni-axial stress inducing portion is configured to function as a source or drain of a field effect transistor, and wherein the metal gate is configured to function as a gate of the field effect transistor.

4. The semiconductor device structure of claim 3, wherein the field effect transistor is configured to function using a voltage potential greater than 0.6 V.

5. The semiconductor device structure of claim 3, further comprising a second uni-axial stress inducing portion having a Germanium concentration formed above the semiconductor substrate and adjacent to the channel layer, the Germanium concentration of the second uni-axial stress inducing portion being greater than or equal to the Germanium concentration of the channel layer.

6. The semiconductor device structure of claim 5, wherein the uni-axial stress inducing portion is configured to function as a source of the field effect transistor, and wherein the second uni-axial stress inducing portion is configured to function as a drain of the field effect transistor.

7. The semiconductor device structure of claim 2, wherein the Germanium concentration of the uni-axial stress inducing portion is graded so that the Germanium concentration at the top of the uni-axial stress inducing portion is greater than the Germanium concentration at the bottom of the uni-axial stress inducing portion.

8. The semiconductor device structure of claim 7, wherein when expressed as percentages, the Germanium concentration at the bottom of the uni-axial stress inducing portion minus the Germanium concentration of the semiconductor substrate is less than 50%.

9. The semiconductor device structure of claim 2, wherein the Germanium concentration of the semiconductor substrate is about 30%, the Germanium concentration of the channel layer is about 60%, the Germanium concentration of the capping layer is about 0%, and the Germanium concentration of the uni-axial stress inducing portion is greater than or equal to 60%.

10. The semiconductor device structure of claim 1, wherein the semiconductor substrate is formed from Silicon having a Germanium concentration of substantially zero.

11. The semiconductor device structure of claim 1, wherein the capping layer is formed from Silicon having a Germanium concentration of substantially zero.

12. The semiconductor device structure of claim 1, further comprising:
an oxide dielectric layer formed to further separate the capping layer from the metal gate.

13. The semiconductor device structure of claim 1, wherein when expressed as percentages, the Germanium concentration of the channel layer minus the Germanium concentration of the semiconductor substrate is less than 50%.

14. A method of fabricating a semiconductor device structure, comprising:
forming a channel layer of a Germanium compound having a Germanium concentration on a top surface of a semiconductor substrate having a Germanium concentration, the Germanium concentration of the semiconductor substrate being less than the Germanium concentration of the channel layer, the channel layer including top and bottom surfaces; and
forming a portion of a capping layer between the top and bottom surfaces of the channel layer to separate the channel layer from a metal gate, the capping layer having a Germanium concentration, the Germanium concentration of the channel layer being greater than the Germanium concentration of the capping layer, wherein forming the channel layer is such that the bottom surface of the channel layer is in contact with the top surface of the semiconductor substrate and at higher elevation than a bottom surface of the metal gate from a bottom surface of the semiconductor substrate.

15. The method of claim 14, further comprising:
forming a uni-axial stress inducing portion having a Germanium concentration above the semiconductor substrate and adjacent to the channel layer, the Germanium concentration of the uni-axial stress inducing portion being greater than or equal to the Germanium concentration of the channel layer.

16. The method of claim 15, wherein the Germanium concentration of the uni-axial stress inducing portion is graded so that the Germanium concentration at the top of the uni-axial stress inducing portion is greater than the Germanium concentration at the bottom of the uni-axial stress inducing portion.

17. The method of claim 16, wherein when expressed as percentages, the Germanium concentration at the bottom of the uni-axial stress inducing portion minus the Germanium concentration of the semiconductor substrate is less than 50%.

18. A semiconductor device structure, comprising:
a semiconductor substrate including a top surface;
a metal gate including a bottom surface;
a channel layer formed of a Germanium compound having a Germanium concentration and including a bottom surface that is in contact with the top surface of the semiconductor substrate, wherein the top surface of the channel layer is at higher elevation than the bottom surface of the metal gate form a bottom surface of the semiconductor substrate; and a uni-axial stress inducing portion having a Germanium concentration formed above the semiconductor substrate and adjacent to the channel layer and configured to function as a source or drain of a transistor, the Germanium concentration of the uni-axial stress inducing portion being greater than the Germanium concentration of the channel layer.

19. The semiconductor device structure of claim 18, wherein the Germanium concentration of the uni-axial stress inducing portion is graded so that the Germanium concentration at the top of the uni-axial stress inducing portion is greater than the Germanium concentration at the bottom of the uni-axial stress inducing portion.

20. The semiconductor device structure of claim 19, wherein:
   the semiconductor substrate has a Germanium concentration of; and
   when expressed as percentages, the Germanium concentration at the bottom of the uni-axial stress inducing portion minus the Germanium concentration of the semiconductor substrate is less than 50%.

* * * * *